United States Patent
Fong et al.

(10) Patent No.: US 11,369,049 B2
(45) Date of Patent: Jun. 21, 2022

(54) ELECTROMAGNETIC SHIELDING ELEMENT, AND TRANSMISSION LINE ASSEMBLY AND ELECTRONIC STRUCTURE PACKAGE USING THE SAME

(71) Applicant: Hotek Material Technology Co., Ltd., Taoyuan (TW)

(72) Inventors: Hao-Wei Fong, New Taipei (TW); Ming-Goo Chien, Taichung (TW); Chia-Yu Wu, New Taipei (TW)

(73) Assignee: HOTEK MATERIAL TECHNOLOGY CO., LTD., Taoyuan (TW)

( * ) Notice: Subject to any disclaimer, the term of this patent is extended or adjusted under 35 U.S.C. 154(b) by 329 days.

(21) Appl. No.: 16/448,077

(22) Filed: Jun. 21, 2019

(65) Prior Publication Data

US 2020/0205321 A1 Jun. 25, 2020

(30) Foreign Application Priority Data

Dec. 19, 2018 (TW) .................................. 107145912

(51) Int. Cl.
*H01L 23/552* (2006.01)
*H05K 9/00* (2006.01)
(Continued)

(52) U.S. Cl.
CPC ....... *H05K 9/0088* (2013.01); *H01L 21/4885* (2013.01); *H01L 23/552* (2013.01);
(Continued)

(58) Field of Classification Search
CPC .. H05K 9/0088; H05K 9/0098; H05K 9/0045; H01L 29/125; H01L 21/4885; H01L 29/122; H01L 31/035209; H01L 31/035236; H01L 23/552; H01L 2224/16227; H01L 2924/16152; H01L 23/66; C23C 14/205; C23C 28/00; C23C 28/32; C23C 28/345; C23C 28/44
See application file for complete search history.

(56) References Cited

U.S. PATENT DOCUMENTS

2006/0248712 A1 * 11/2006 Jo .................. H05K 1/0218
29/830

FOREIGN PATENT DOCUMENTS

| CN | 1522107 A | * | 8/2004 | |
| JP | 05226750 A | * | 9/1993 | |
| JP | 06152052 A | * | 5/1994 | ............ B82Y 20/00 |

* cited by examiner

*Primary Examiner* — Ermias T Woldegeorgis
(74) *Attorney, Agent, or Firm* — Li & Cai Intellectual Property (USA) Office

(57) ABSTRACT

An electromagnetic shielding element and, transmission line assembly and electronic structure package using the same are provided. The electromagnetic shielding element is applied to the transmission line assembly and the electronic structure package to shield electromagnetic noise. The electromagnetic shielding element includes a quantum well structure, and the quantum well structure includes at least two barrier layers and at least one carrier confined layer located between the two barrier layers. Each barrier layer has a thickness between 0.1 nm and 500 nm, and the thickness of the carrier confined layer is between 0.1 nm and 500 nm. The electromagnetic shielding element absorbs electromagnetic wave noise to suppress electromagnetic interference.

19 Claims, 6 Drawing Sheets

(51) Int. Cl.
   *H01L 29/12*       (2006.01)
   *H01L 31/0352*     (2006.01)
   *H01L 21/48*       (2006.01)
   *C23C 14/20*       (2006.01)

(52) U.S. Cl.
   CPC .......... *H01L 29/122* (2013.01); *H01L 29/125* (2013.01); *H01L 31/035209* (2013.01); *H01L 31/035236* (2013.01); *H05K 9/0045* (2013.01); *H05K 9/0098* (2013.01); *C23C 14/205* (2013.01)

ELECTROMAGNETIC SHIELDING ELEMENT, AND TRANSMISSION LINE ASSEMBLY AND ELECTRONIC STRUCTURE PACKAGE USING THE SAME

CROSS-REFERENCE TO RELATED PATENT APPLICATION

This application claims the benefit of priority to Taiwan Patent Application No. 107145912, filed on Dec. 19, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electromagnetic shielding element, and transmission line assembly and electronic structure package using the same, and more particularly to an electromagnetic shielding element capable of effectively suppressing crosstalk during high-frequency signal transmission, and transmission line assembly and electronic structure package using the same.

BACKGROUND OF THE DISCLOSURE

In recent years, with the development of electronic products towards a light and thin trend and high-frequency and high-speed signal transmission requirements, the configuration of transmission wires between various chips in electronic products (such as wireless communication chips) and cables used for transmitting high-frequency signals are getting increasingly denser.

Accordingly, when a chip is operated at a high frequency, electromagnetic waves generated by the chip easily cause electromagnetic interference to other chips. Similarly, when a high frequency signal is transmitted through a transmission line inside the cable, it is easy for two adjacent transmission lines to crosstalk each other due to coupling or scattering of electromagnetic waves. In the related art, the metal shielding layer is usually covered on the outside of the chip or a cable for transmitting high frequency signals to prevent electromagnetic interference.

However, this technical solution can only reduce interference from the outside of the metal shield, but other interference would be generated. Specifically, the metal shield layer can absorb high frequency electromagnetic waves while absorbing low frequency electromagnetic waves. Therefore, the high-frequency electromagnetic waves generated by the transmission line covered by the metal shield layer are not absorbed by the metal shield layer, but are reflected and become noises for signal transmission.

SUMMARY OF THE DISCLOSURE

In response to the above-referenced technical inadequacies, the present disclosure provides an electromagnetic shielding element for reducing electromagnetic wave noise, especially high frequency electromagnetic wave noise, and crosstalk caused by the signal transmission line.

In one aspect, the present disclosure provides an electromagnetic shielding element. The electromagnetic shielding element includes at least one quantum well structure. The quantum well structure includes two barrier layers and a carrier confined layer located between the two barrier layers. The thickness of each barrier layer is between 0.1 nm to 500 nm, and the thickness of the carrier confined layer is between 0.1 nm and 500 nm.

Preferably, the electromagnetic shielding element further includes a base layer, and the quantum well structure is disposed on the base layer. Preferably, the base layer includes an isolating layer, the thickness of the isolating layer is between 5 μm and 100 μm, and the material of the isolating layer is at least one selected from the group consisting of polyimide (PI), polyethylene (PE), polypropylene (PP), epoxy resin (Epoxy), poly (methyl methacrylate) (PMMA), polyethylene terephthalate (PET), polyethylene naphthalate (PEN), polycarbonate (PC), polyether sulfone (PES), polyarylate, liquid crystal polymer (LCP) and any combination thereof.

Preferably, the base layer further includes a conductive layer, the conductive layer and the isolating layer are located on the same side of the quantum well structure, and the thickness of the conductive layer is between 5 μm and 200 μm.

Preferably, the material of the conductive layer is selected from the group consisting of gold, silver, copper, iron, zinc, lead, cobalt, chromium, aluminum, nickel, and any combination or any alloy thereof.

Preferably, the isolating layer is located between the conductive layer and the quantum well structure.

Preferably, the material of the barrier layer is an oxide, a nitride, an oxynitride or any combination thereof.

Preferably, the material of the carrier confined layer is a semiconductor, a metal, an alloy or any combination thereof.

Preferably, an energy barrier at the interface between a conduction band of each barrier layer and a conduction band of the adjacent carrier confined layer is at least 0.2 eV.

Preferably, the quantum well structure is a multiple quantum well structure, and the quantum well structure includes a plurality of barrier layers stacked alternately and a plurality of carrier confined layers. The barrier layers include an outer barrier layer and an inner barrier layer, and the carrier confined layers are located between the outer barrier layer and the inner barrier layer.

Preferably, at least two of the barrier layers or at least two of the carrier confined layers have different thicknesses, respectively.

Preferably, the materials of at least two barrier layers or at least two carrier confined layers are different.

Preferably, the quantum well structure further includes another carrier confined layer located between the two barrier layers, and the two carrier confined layers are directly connected to each other and have different energy gap respectively.

In one aspect, the present disclosure provides a transmission line assembly. The transmission line assembly includes a wire assembly and an electromagnetic shield. The wire assembly includes at least a wire and a wire-wrapping insulation layer. The electromagnetic shielding element is disposed on the wire assembly and has a quantum well structure. The quantum well structure includes at least two barrier layers and at least one carrier confined layer located between the two barrier layers.

Preferably, the electromagnetic shielding element further includes a base layer, the quantum well structure being located between the base layer and the wire assembly.

Preferably, the base layer includes an isolating layer and a conductive layer, and the isolating layer is located between the quantum well structure and the conductive layer.

Preferably, the quantum well structure is a multiple quantum well structure, and the quantum well structure includes a plurality of barrier layers stacked alternately and a plurality of carrier confined layers. The barrier layers include an outer barrier layer and an inner barrier layer, and the carrier confined layers are located between the outer barrier layer and the inner barrier layer.

Preferably, the thickness of each barrier layer is between 0.1 nm and 500 nm, and the thickness of the carrier confined layer is between 0.1 nm and 500 nm.

In one aspect, the present disclosure provides an electronic structure package. The electronic structure package includes an electronic component, a protective layer, and an electromagnetic shielding element. The protective layer covers the electronic component, and the electromagnetic shielding element is disposed on the protective layer and includes a quantum well structure. The quantum well structure includes at least two barrier layers and at least one carrier confined layer located between the two barrier layers.

Preferably, the electronic component is a resistor, a capacitor or a chip. In one aspect, the present disclosure provides an electronic structure package applied to a filter circuit. The electronic structure package includes at least an electronic component which is a capacitor and includes two electrode structures and a dielectric layer interposed between the two electrode structures. At least one of the electrode structures includes a quantum well structure, and the quantum well structure includes at least two barrier layers and at least one carrier confined layer located between the two barrier layers.

Therefore, one of the beneficial effects of the present disclosure is that through the technical feature of "electromagnetic shielding element including quantum well structure", the electromagnetic shielding element and the transmission line assembly and electronic structure package using the same provided by the present disclosure can absorb electromagnetic wave noise to suppress electromagnetic interference.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
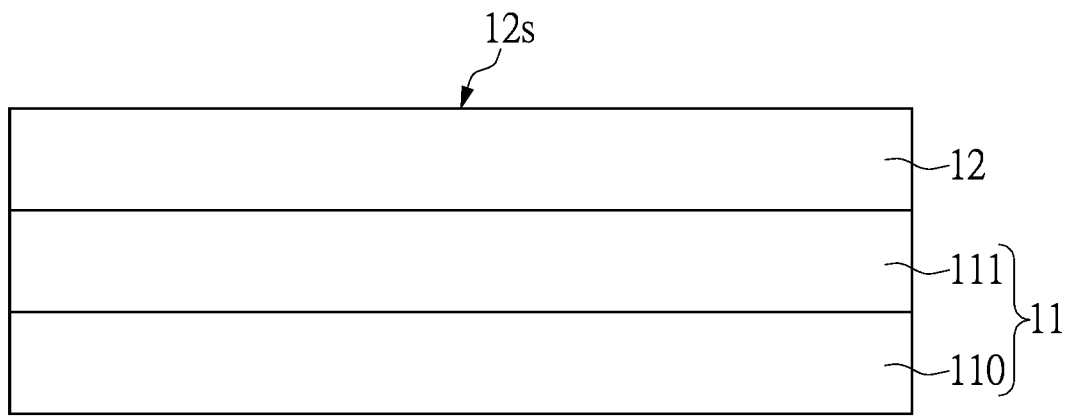
FIG. 1 is a schematic view of an electromagnetic shielding element according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, in an embodiment of the present disclosure, an electromagnetic shielding element 1 has at least a quantum well structure 12 to achieve an effect of shielding electromagnetic interference. FIG. 1 is a schematic view of an electromagnetic shielding element according to an embodiment of the present disclosure.

The electromagnetic shielding element 1 of the embodiment includes a base layer 11 and the quantum well structure 12 disposed on a base layer 11.

In one embodiment, the material and structure of the base layer 11 are not limited to the embodiments provided by the present disclosure. Specifically, the base layer 11 may be a plate material or a sheet material having a single layer structure or a multilayer structure. In addition, the material of the base layer 11 may be selected from a hard material or a flexible material depending on practical applications. Accordingly, the material of the base layer 11 may be a ceramic material, a metal material, a polymer material, a semiconductor material, or a composite material.

In addition, in other embodiments, the base layer 11 may also be omitted when the quantum well structure 12 is formed directly on other components or structures.

In the embodiment of the present disclosure, the base layer 11 can assist the quantum well structure 12 to shield electromagnetic interference. Specifically, the base layer 11 of the embodiment includes a conductive layer 110 and an isolating layer 111, and the isolating layer 111 is sandwiched between the conductive layer 110 and the quantum well structure 12.

The material of the isolating layer is at least one selected from the group consisting of polyimide (PI), polyethylene (PE), polypropylene (PP), epoxy resin (Epoxy), poly (methyl methacrylate) (PMMA), polyethylene terephthalate (PET), polyethylene naphthalate (PEN), polycarbonate (PC), polyether sulfone (PES), polyarylate, liquid crystal polymer (LCP) and any combination thereof. In addition, the thickness of the isolating layer 111 is between 1 μm and 100 μm.

The material of conductive layer 110 is selected from the group consisting of gold, silver, copper, iron, zinc, lead, cobalt, chromium, aluminum, nickel, and any combination or alloys thereof. In one embodiment, the material of the conductive layer 110 may be an alloy of different metals, such as a copper aluminum alloy. However, the present disclosure is not limited thereto. In addition, the thickness of the conductive layer 110 is between 1 μm and 200 μm.

It should be noted that the conductive layer 110 has a higher absorption rate for low frequency electromagnetic waves than high frequency electromagnetic waves. On the other hand, the conductive layer 110 has a high reflectance for high frequency electromagnetic waves. The aforementioned low frequency electromagnetic wave refers to an electromagnetic wave having a frequency between 100 kHz and 1 GHz, and the high frequency electromagnetic wave refers to an electromagnetic wave having a frequency between 1 GHz and 80 GHz. Since the conductive layer 110 can absorb a part of low-frequency electromagnetic waves, when the electromagnetic shielding element 1 is applied to a transmission line or an electronic structure package, interference of electromagnetic waves from the external environment to the transmission wire or the chip can be suppressed.

However, in another embodiment, the positions of the conductive layer 110 and the isolating layer 111 may also be interchanged with each other. In other words, the conductive layer 110 can also be located between the isolating layer 111 and the quantum well structure 12.

Figure 2:
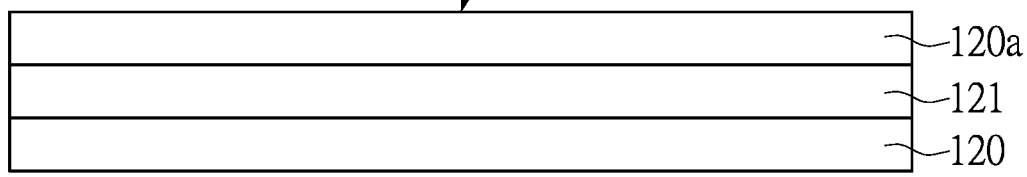
FIG. 2 is a partially enlarged schematic view of a quantum well structure according to the embodiment of the present disclosure.
Figure 2:
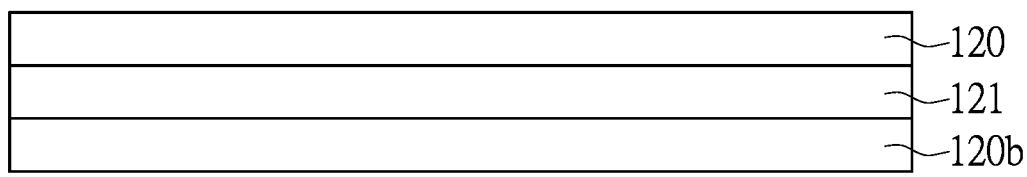
Figure 3:
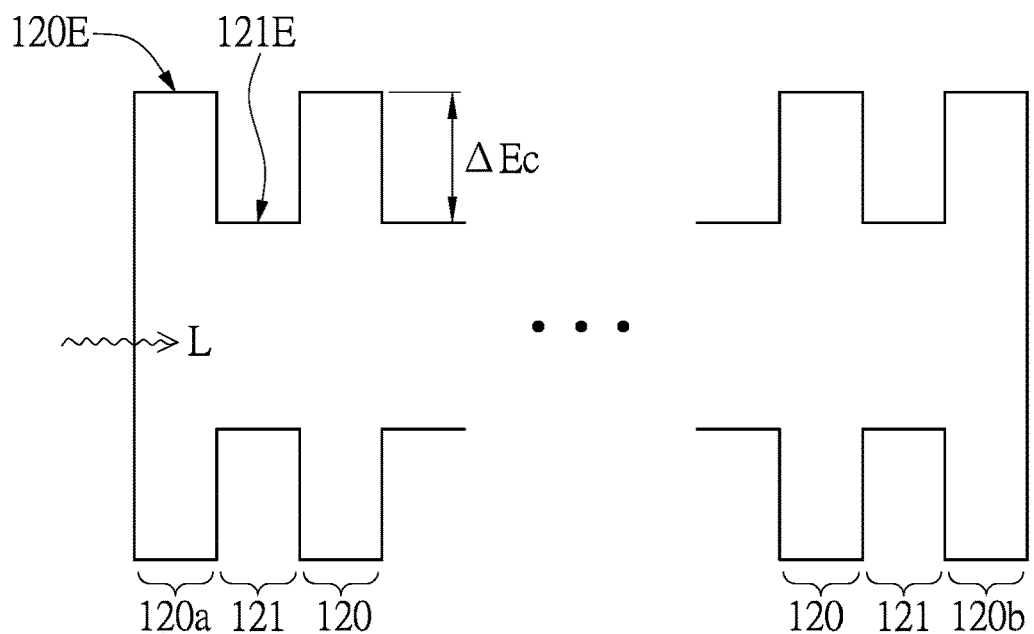
FIG. 3 is a schematic view of an energy band structure of the quantum well structure according to the embodiment of the present disclosure.

Referring to FIG. 1, the quantum well structure 12 is disposed on the base layer 11. Referring to FIG. 2 and FIG. 3 together, FIG. 2 is a partially enlarged schematic view of a quantum well structure according to the embodiment of the present disclosure, and FIG. 3 is a schematic view of an energy band structure of the quantum well structure according to the embodiment of the present disclosure.

As shown in FIG. 2, the quantum well structure 12 includes at least two barrier layers 120 and a carrier confined layer 121 located between the two barrier layers 120. In the embodiment of the present disclosure, the quantum well structure 12 is a multiple quantum well structure, and includes a plurality of barrier layers 120 alternately stacked and a plurality of carrier confined layers 121.

Referring to FIG. 3, the energy gap of each barrier layer 120 is greater than the energy gap of each carrier confined layer 121. In other words, the material of the barrier layer 120 is a wide energy gap (or band gap) material and the material of the carrier confined layer 121 is a narrow energy gap material.

In addition, a conduction band 120E of each barrier layer 120 (e.g., outer barrier layer 120a) and a conduction band 121E of the adjacent carrier confined layer 121 form an energy barrier ΔEc (or Schottky barrier). In one embodiment, the energy barrier ΔEc formed at the interface between the conduction band 120E of each barrier layer 120 and the conduction band 121E of each carrier confined layer 121 is at least 0.2 eV. As shown in FIG. 3, the two-layer barrier layer 120 and the energy band structure of the carrier confined layer 121 sandwiched therein form a quantum well.

Further, the material of the barrier layer 120 can be an oxide, a nitride, an oxynitride, or any combination thereof. The oxide is, for example, but not limited to, silicon oxide, aluminum oxide, zinc oxide, tin dioxide or indium trioxide. In addition, the oxide may be a doped oxide such as tin dioxide doped in indium trioxide, tin dioxide doped in zinc oxide, and aluminum oxide doped in zinc oxide. The nitride is, for example, titanium nitride, aluminum nitride, chromium nitride, indium nitride, indium gallium nitride, indium aluminum gallium nitride or the like. Each barrier layer 120 has a thickness between 0.1 nm and 500 nm.

The material of the carrier confined layer 121 may be a semiconductor, a metal, an alloy, or any combination thereof. Further, the semiconductor is, for example, but not limited to, amorphous carbon, polycrystalline carbon, graphite, graphene, amorphous silicon, polycrystalline silicon, germanium, gallium arsenide, indium gallium arsenide or the like. The metal is, for example, but not limited to, gold, silver, copper, aluminum, nickel, zinc, indium, or the like. The alloy is, for example, but not limited to, silicon germanium alloy, nickel aluminum alloy, copper zinc alloy or the like. The thickness of each carrier confined layer is between 0.1 nm and 500 nm.

The plurality of barrier layers 120 of the quantum well structure 12 and the plurality of carrier confined layers 121 may be manufactured by physical vapor deposition or chemical vapor deposition. In one embodiment, the quantum well structure 12 is prepared by sputtering to reduce manufacturing costs.

Accordingly, when electromagnetic wave L enters quantum well structure 12, barrier layer 120 absorbs electromagnetic waves so that its valence band electrons are excited to conduction band 120E. After the electrons are excited to conduction band 120E, the electrons enter the quantum well and are confined within the quantum well. Therefore, electromagnetic waves entering the quantum well structure 12 would be absorbed and difficult to penetrate or reflect outside the quantum well structure 12. The thickness of the barrier layer 120 is not necessarily the same as the thickness of the carrier confined layer 121.

It should be noted that the material and thickness of the barrier layer 120, as well as the material and thickness of the carrier confined layer 121, are related to the electromagnetic wave region that the quantum well structure 12 can absorb. Accordingly, by selecting a specific material as the barrier layer 120 and the carrier confined layer 121, and respectively making the barrier layer 120 and the carrier confined layer 121 have specific thicknesses, the quantum well structure 12 can have a better absorption effect for electromagnetic waves of a specific wavelength region.

In addition, the materials and thicknesses of the plurality of barrier layers 120 are not necessarily the same, and the materials and thicknesses of the plurality of carrier confined layers 121 are not necessarily the same, so that the quantum well structure 12 can be used to absorb electromagnetic waves of different wavelength regions. That is, in one embodiment, at least two layers of barrier layers 120 may have different thicknesses or different energy gap, respectively.

For example, the plurality of barrier layers 120 may be a titanium nitride layer and an aluminum nitride layer stacked according to a predetermined period, and the titanium nitride layer and the aluminum nitride layer may have different thicknesses, respectively. Since the titanium nitride layer and the aluminum nitride layer respectively have different band gaps and thicknesses, the titanium nitride layer and the aluminum nitride layer respectively correspond to electromagnetic waves absorbing different wavelength regions.

Similarly, in still another embodiment, at least two layers of carrier confined layer 121 have different thicknesses or different energy gap, respectively.

Accordingly, in the embodiment of the present disclosure, by adjusting the material and thickness of each barrier layer 120, or adjusting the material and thickness of each carrier confined layer 121, the quantum well structure 12 can at least be used to absorb at least one electromagnetic wave having a frequency ranging from 1 GHz to 80 GHz.

In other embodiments, the quantum well structure 12 can absorb electromagnetic waves of a lower frequency band (e.g., electromagnetic waves of 30 MHz to 1 GHz). That is, the electromagnetic wave region to be absorbed by the quantum well structure 12 can be adjusted according to actual needs, and the present disclosure is not limited thereto.

Referring to FIG. 2 and FIG. 3, in the embodiment of the present disclosure, the plurality of barrier layers 120 includes an outer barrier layer 120a and an inner barrier layer 120b, and the plurality of carrier confined layers 121 are located between the outer barrier layer 120a and the inner barrier layer 120b. In the embodiment of the present disclosure, the quantum well structure 12 is disposed with the inner barrier layer 120b facing the isolating layer 111, and one of the surfaces of the outer barrier layer 120a is the outer surface 12s of the quantum well structure 12.

In one embodiment, the energy gap of the outer barrier layer 120a or the inner barrier layer 120b is greater than the energy gap of the other barrier layers 120 to increase the barrier height of the outer quantum well. Thus, the probability that electrons trapped within the quantum well being able to cross the quantum well beyond the energy barrier can be reduced and further reduce interference with high frequency signal transmission.

Figure 4:
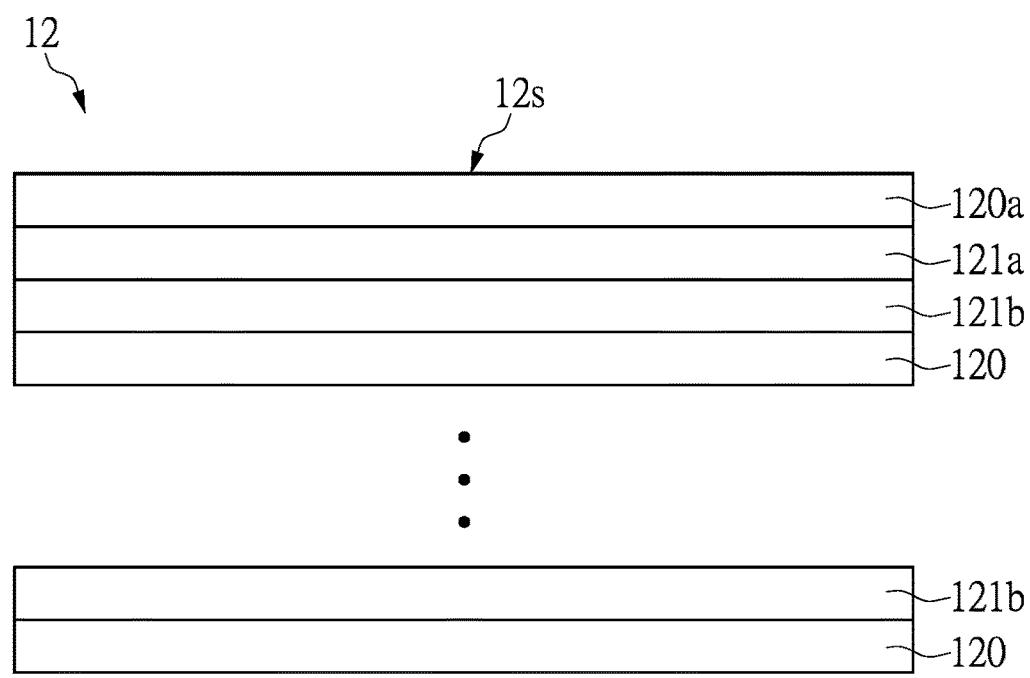
FIG. 4 is a partially enlarged schematic view of a quantum well structure according to another embodiment of the present disclosure.
Figure 5:
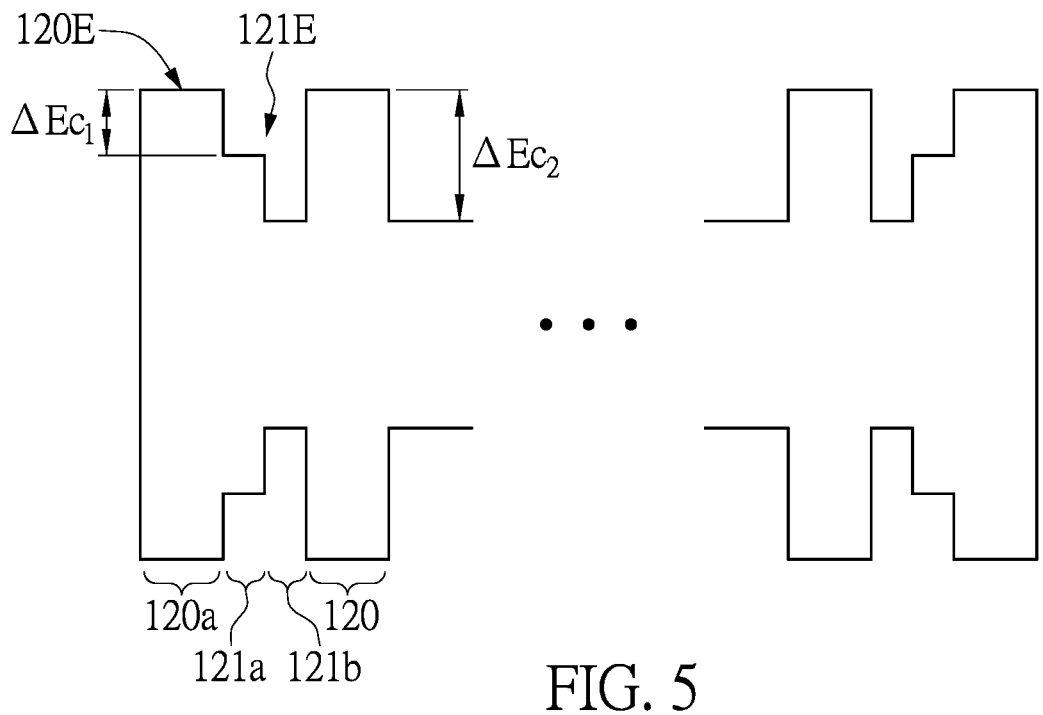
FIG. 5 is a schematic view of an energy band structure of a quantum well structure according to another embodiment of the present disclosure.

FIG. 4 is a partially enlarged schematic view of a quantum well structure according to another embodiment of the present disclosure, and FIG. 5 is a schematic view of an energy band structure of a quantum well structure according to another embodiment of the present disclosure. In the quantum well structure 12 of the embodiment of the present disclosure, the two layers of carrier confined layers 121a, 121b are directly connected to each other. As shown in FIG. 4, two layers of carrier confined layers 121a, 121b connected to each other are sandwiched between the outer barrier layer 120a and the barrier layer 120.

As shown in FIG. 5, the two layers of carrier confined layers 121a, 121b connected to each other have different energy gap. In the embodiment of FIG. 5, the energy gap of the carrier confined layer 121a is greater than the energy gap of the other carrier confined layer 121b. Accordingly, when the materials of all the barrier layers (including the outer barrier layer 120a and the barrier layer 120) are the same, the energy barrier $\Delta Ec1$ at the interface between the conduction band of the carrier confined layer 121a and the conduction band of the barrier layer 120 may be smaller than the energy barrier $\Delta Ec2$ at the interface between the conduction band of the other carrier confined layer 121b and the conduction band of the barrier layer.

In addition, the carrier confined layers 121a, 121b may have different thicknesses, respectively. In one embodiment, the thickness of the carrier confined layer 121b having a smaller energy gap may be greater than the thickness of the carrier confined layer 121b having a larger energy gap.

In the present disclosure, the number of carrier confined layers between the two closest barrier layers 120 is not limited to the abovementioned embodiment. That is to say, there may be a plurality of carrier confined layers between the two closest barrier layers 120, and the energy gap, material or thickness of these carrier confined layers are not necessarily the same.

Figure 6:
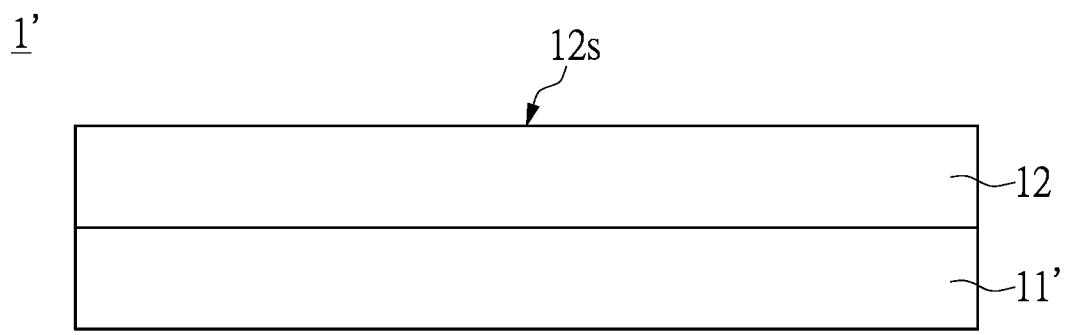
FIG. 6 is a schematic diagram of an electromagnetic shielding element according to another embodiment of the present disclosure.

Referring to FIG. 6, FIG. 6 is a schematic diagram of an electromagnetic shielding element according to another embodiment of the present disclosure. The difference of the embodiment of the present disclosure and the embodiment of FIG. 1 is that, in an electromagnetic shielding element 1' of the embodiment of the present disclosure, a base layer 11' has only a single layer structure. Further, the base layer 11' may be an isolating layer 111 or a conductive layer 110.

When the base layer 11' is a conductive layer 110 capable of absorbing lower frequency electromagnetic waves, the quantum well structure 12 can be mainly used to absorb high frequency electromagnetic waves by adjusting the thickness and material of the barrier layer 120 and the carrier confined layer 121. In addition, when the base layer 11 is the isolating layer 111, by changing the thickness and material of the barrier layer 120 and the carrier confined layer 121, the quantum well structure 12 can be used to absorb low frequency and high frequency electromagnetic waves.

That is, in the embodiment of the present disclosure, as long as the electromagnetic shielding element 1 has at least a quantum well structure 12, the material and structure of the base layer 11 are not limited. Accordingly, in another embodiment, the base layer 11 can also be omitted.

Based on the above, the electromagnetic shielding element 1 of the embodiment of the present disclosure can be applied to a transmission line and an electronic structure package to shield electromagnetic interference and suppress high frequency signal crosstalk.

Figure 7:
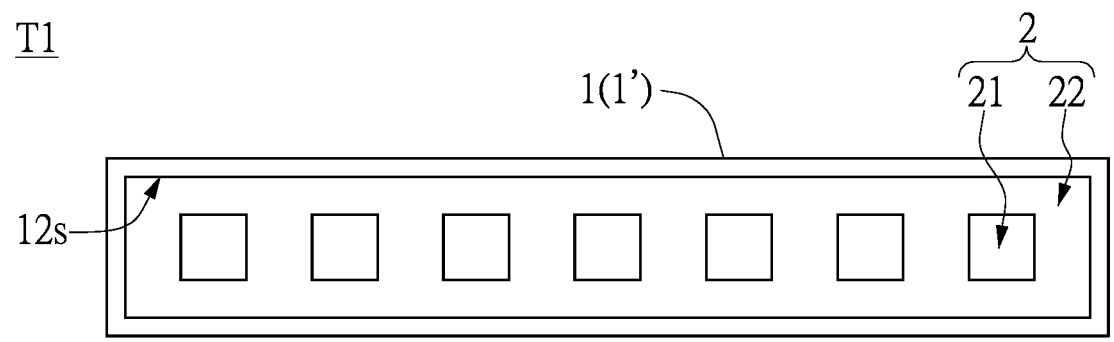
FIG. 7 is a cross-sectional view of a transmission line assembly according to one embodiment of the present disclosure.

Referring to FIG. 7, FIG. 7 is a cross-sectional view of a transmission line assembly according to one embodiment of the present disclosure. The transmission line assembly T1 of the embodiment includes a wire assembly 2 and an electromagnetic shielding element 1 (1').

Specifically, the transmission line assembly T1 may be a soft flat cable, a flexible circuit board or a coaxial cable. In the present embodiment, the wire assembly 2 includes at least one wire 21 for transmitting signals (examples are illustrated in FIG. 7) and a wire-wrapping insulation layer 22.

The material of the insulation layer 22 is, for example, polyimide (PI), polyethylene naphthalate (PEN), polyethylene terephthalate (PET), polycarbonate (PC), polyethersulfone (PES), polyarylate or other suitable material, but the present disclosure is not limited thereto.

The electromagnetic shielding elements 1, 1' are disposed on the wire assembly 2. Specifically, the electromagnetic shielding elements 1, 1' would surround the wire assembly 2, that is, the outer surface of the insulation layer 22, so as to shield electromagnetic interference. In the embodiment of FIG. 7, the electromagnetic shielding elements 1, 1' are completely wrapped around the wire assembly 2. However, in other embodiments, the electromagnetic shielding elements 1, 1' may also cover only a portion of the surface of the wire assembly 2.

It should be noted that in the present embodiment, the electromagnetic shielding elements 1, 1' are disposed toward the wire assembly 2 with the outer surface 12s of the quantum well structure 12. That is, when the electromagnetic shielding elements 1, 1' are disposed on the wire assembly 2, the quantum well structure 12 is located between the base layers 11, 11' and the wire assembly 2.

Accordingly, when transmitted by the high-frequency signal, most of the high-frequency electromagnetic waves radiated by the wire 21 can be absorbed by the quantum well structure 12 and are not reflected back to the wire 21, thereby avoiding an increase in signal mutual interference.

In a preferred embodiment, the base layer 11 includes a conductive layer 110 and an isolating layer 111, and the isolating layer 111 is located between the conductive layer 110 and the quantum well structure 12. Comparing with other embodiments, the quantum well structure 12 cooperates with the conductive layer 110 and the isolating layer 111 to shield electromagnetic interference and suppress signal mutual interference more effectively.

Figure 8:
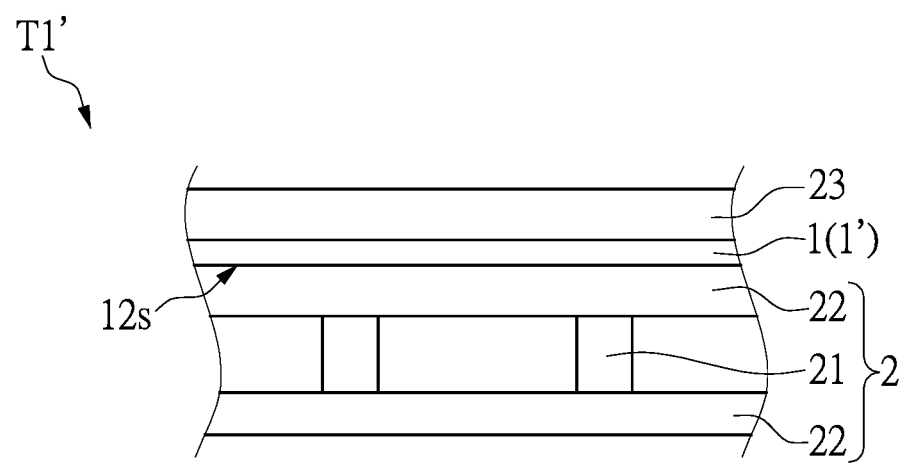
FIG. 8 is a cross-sectional view of a transmission line assembly according to another embodiment of the present disclosure.

Referring to FIG. 8, FIG. 8 is a cross-sectional view of a transmission line assembly according to another embodiment of the present disclosure. The transmission line assembly T1' of the present embodiment is a flexible flat cable and includes at least a wire assembly 2' and electromagnetic shielding elements 1, 1'.

The wire assembly 2' of this embodiment includes a plurality of wires 21 separated from each other and at least one insulation layer 22. In the present embodiment, two layers of the insulation layer 22 are disposed on opposite sides of the wire 21 through an insulating layer (not shown).

The detailed structure of the electromagnetic shielding element 1 (1') can be referred to FIG. 1 to FIG. 6 and will not be described herein. The electromagnetic shielding element 1 (1') is disposed on the wire assembly 2' to prevent electromagnetic interference. Further, the electromagnetic shielding element 1 (1') may be disposed on one of the insulation layers 22 through a conductive adhesive layer (not shown) and disposed toward the insulating layer 22 with the quantum well structure 12. In other embodiments, the electromagnetic shielding element 1 (1') may omit the base layer 11 and only have the quantum well structure 12.

The transmission line assembly T1' may further include a metal layer 23, and the metal layer 23 is disposed on the electromagnetic shielding element 1 (1'). The metal layer 23 is an aluminum layer and has a thickness of less than 0.001 mm, and can control the characteristic impedance of the wire assembly 2'. In other embodiments, the metal layer 23 can also be omitted.

Figure 9:
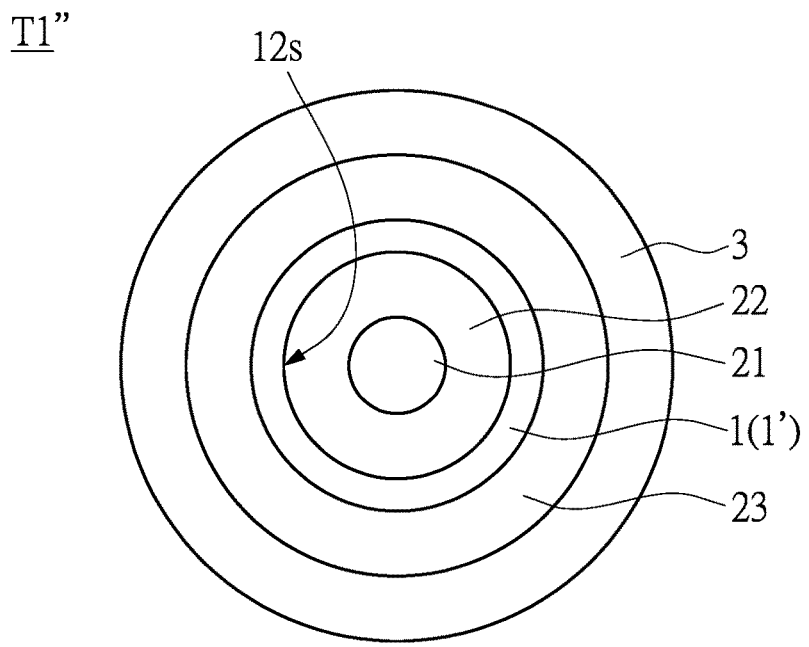
FIG. 9 is a cross-sectional view of a transmission line assembly according to still another embodiment of the present disclosure.

Referring to FIG. 9, FIG. 9 is a cross-sectional view of a transmission line assembly according to still another embodiment of the present disclosure. As shown in FIG. 9, the transmission line assembly T1" is a coaxial cable and includes at least one wire 21, an insulation layer 22, a metal layer 23, an electromagnetic shielding element 1 (1'), and a cladding layer 3.

The wire 21 is wrapped within the insulation layer 22 for signal transmission. Both the metal layer 23 and the electromagnetic shielding element 1 (1') cover the outer surface of the insulating layer 22, and the electromagnetic shielding element 1 (1') is located between the metal layer 23 and the insulating layer 22. The metal layer 23 may be an aluminum layer to shield electromagnetic interference.

Similar to the previous embodiment, the quantum well structure 12 of the electromagnetic shielding element 1 (1') will be located on the inside, and the outer surface 12s of the quantum well structure 12 will face the insulation layer 22 to prevent signal crosstalk. In one embodiment, the electromagnetic shielding element 1 (1') does not have a base layer 11 (11') but only a quantum well structure 12.

However, in the transmission line assembly T1" of another embodiment, the metal layer 23 can be omitted, and the effect of shielding electromagnetic interference and preventing signal crosstalk can also be achieved. In addition, the material of the cladding layer 3 is an insulating material and is the outermost layer of the transmission line assembly T1" as a protective layer.

Figure 10:
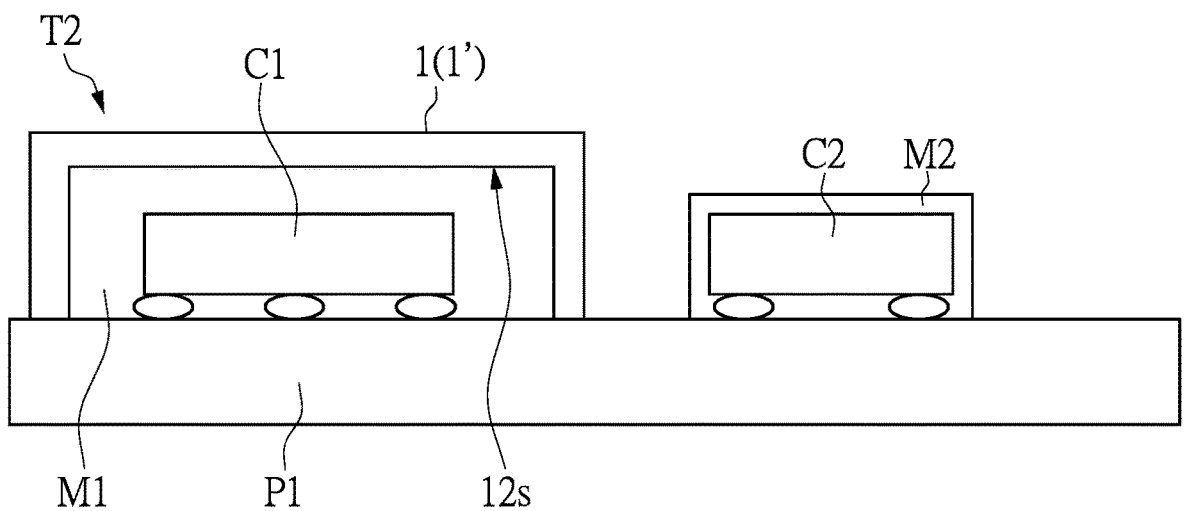
FIG. 10 is a schematic diagram of an electronic structure package according to yet another embodiment of the present disclosure.

The electromagnetic shielding elements 1, 1' of the embodiments of the present disclosure can also be applied to an electronic structure package. Referring to FIG. 10, FIG. 10 is a schematic diagram of an electronic structure package according to yet another embodiment of the present disclosure. In this embodiment, the electronic structure package T2 includes at least an electronic component C1, a protective layer M1, and an electromagnetic shielding element 1 (1').

In the present embodiment, the electronic structure package T2 is disposed on the carrier board P1. In addition, another electronic component C2 is also disposed on the carrier board P1. The carrier board P1 is, for example, a circuit board and has a plurality of predetermined circuits (not shown) and pads (not labeled). The electronic components C1 and C2 are respectively disposed on the carrier board P1 through a plurality of corresponding pads.

Electronic component C1 can be a capacitor, resistor or chip. In one embodiment, the electronic component C1 is a communication chip, such as a radio frequency chip, a Wi-Fi chip, a GPS chip, a Bluetooth chip, a modem chip, or a 5G chip and so on. Another electronic component C2 can be an active component or a passive component.

The protective layer M1 covers the electronic component C1 without covering another electronic component C2. That is to say, two electronic components C1 and C2 are respectively covered by two layers of protective layers M1 and M2 to form two electronic structure packages that are disposed separately from each other.

In order to avoid the electromagnetic wave generated by the electronic component C1 from interfering with another electronic component C2 on the carrier board P1, the electromagnetic shielding element 1 is disposed on the protective layer M1 covering one of the electronic component C1. Specifically, the electromagnetic shielding element 1 will cover the outer surface of the protective layer M1.

In the embodiment, the structure of the electromagnetic shielding element 1 (1') can be referred to the embodiment shown in FIG. 1, FIG. 2 and FIG. 4. In one embodiment, the electromagnetic shielding element 1 (1') may be formed first, and then the electromagnetic shielding element 1 (1') may be disposed on the protective layer M1. In another embodiment, the quantum well structure 12 can be formed directly on the protective layer M1 directly on the protective layer M1. Thereafter, an isolating layer 111 and a conductive layer 110 are formed on the quantum well structure 12.

In the above embodiment, the quantum well structure 12 will be located between the base layer 11 and the protective layer M1. However, in other embodiments, the electromagnetic shielding element 1 (1') disposed on the protective layer M1 may also omit the base layer 11 (11') and only have the quantum well structure 12. That is, the quantum well structure 12 is formed directly on the protective layer M1.

In another embodiment, the electronic structure package T2 can be applied in a low pass or high pass filter circuit, and the electronic component C1 can be a capacitor or a resistor. In addition, the electromagnetic shielding element 1 (1') can be disposed not only as the protective layer M1 but also as one of the electronic component C1 structures.

For example, when electronic component C1 is a capacitor, quantum well structure 12 can be applied to at least one electrode structure of the capacitor. Specifically, the electronic component C1 is a capacitor, and may include at least two electrode structures (not shown) and a dielectric layer (not shown) sandwiched between the two electrode structures, and at least one of the electrode structures has a quantum well structure. The quantum well structure is, for example, the quantum well structure 12 in FIG. 2 or FIG. 4.

In one embodiment, the electrode structure of the capacitor can be directly replaced by a quantum well structure 12, and the barrier layer 120 and the carrier confined layer 121 of the quantum well structure 12 are all conductive materials. Accordingly, the quantum well structure 12 can be used to absorb or suppress electromagnetic waves in a specific frequency band, and can be electrically connected to an end point of an external circuit as the electronic component C1. For example, the material of the barrier layer 120 is, for example, titanium nitride, and the material of the carrier confined layer 121 is, for example, a carbon layer.

In another embodiment, the at least one electrode structure includes a conductive layer and a quantum well structure, and the conductive layer is located between the quantum well structure 12 and the dielectric layer. The conductive layer is electrically connected to the end of the external circuit as the electronic component C1. In this case, the barrier layer 120 and the carrier confined layer 121 of the quantum well structure 12 do not have to adopt a conductive material. That is, in the present embodiment, the barrier layer 120 and the carrier confined layer 121 may also be insulating materials as long as the quantum well structure 12 can be used to absorb or suppress electromagnetic waves in a specific frequency band.

Based on the above, the material, energy gap or thickness of the barrier layer 120, 120a, 120b and the carrier confined layer 121, 121a, 121b in the quantum well structure 12 (refer to FIGS. 2 and 4) may be adjusted according to whether the electronic component C1 is applied to a high-pass filter circuit or a low-pass filter circuit.

Figure 11:
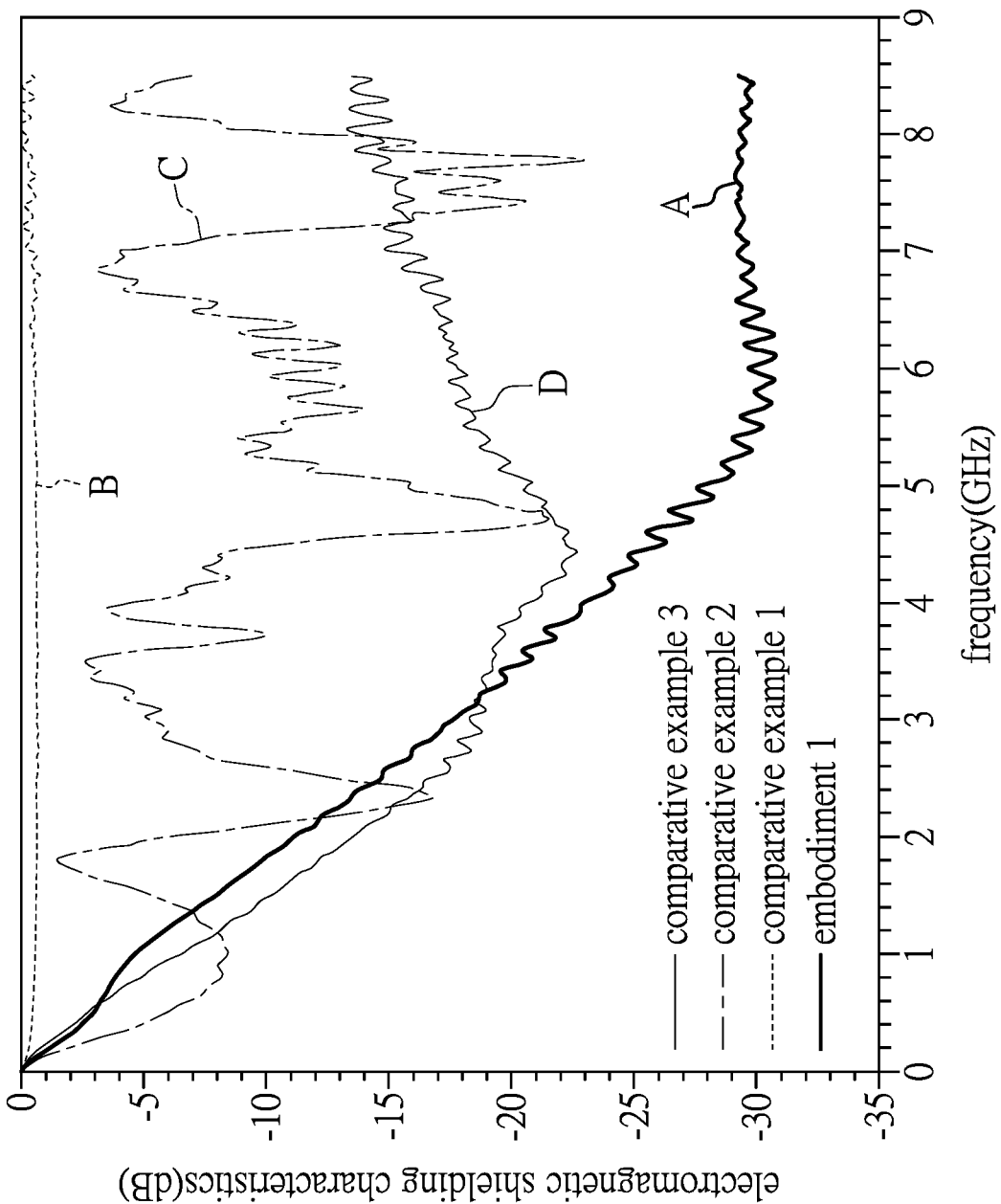
FIG. 11 is a graph of electromagnetic shielding characteristic curve of a comparative well and a quantum well structure according to the embodiment of the present disclosure.

Referring to FIG. 11, FIG. 11 is a graph of electromagnetic shielding characteristic curve of a comparative well and a quantum well structure according to the embodiment of the present disclosure. A curve A represents the electromagnetic shielding characteristics of the electromagnetic wave of the present embodiment 1 for the frequency band between 1 and 8.5 GHz. Curves B, C, and D represent the electromagnetic shielding characteristics of comparative example 1-3 for electromagnetic waves having a frequency band between 1 and 8.5 GHz, respectively. In embodiment 1, the test was carried out with a quantum well structure.

Further, in comparative examples 1, 2, and 3, the test was conducted using a carbon layer, a graphene layer, and a ferrite material layer, respectively. It should be noted that, the total thickness of the quantum well structure of embodiment 1 is only about 0.3 µm. However, in comparative example 1-3, the thickness of the carbon layer, the graphene layer or the iron-plated layer was about 1 µm to 30 µm.

However, according to FIG. 11, as the frequency increases, the shielding effect of the electromagnetic wave of embodiment 1 is better, and particularly, the electromagnetic wave having a frequency exceeding 4 GHz or more has an excellent and stable shielding effect. In contrast, comparative example 1 has almost no shielding effect for electromagnetic waves having a frequency band between 1 and 8.5 GHz. Comparative example 2 has no particular tendency to shield electromagnetic waves in the frequency range from 1 to 8.5 GHz and is difficult to be applied to existing transmission line assembly. In comparative example 3, the shielding effect on electromagnetic waves having a frequency exceeding 4 GHz or more is inferior. From the above test results, it can be proved that the quantum well structure 12 can be used to shield electromagnetic waves as at least one of the structures of the electromagnetic shielding element.

On the other hand, from the results of FIG. 11, although the thickness of embodiment 1 is only one-hundredth of the thickness of comparative examples 1, 2 and 3, it has a better electromagnetic wave shielding effect.

In summary, one of the beneficial effects of the present disclosure is that in the electromagnetic shielding element 1 and the transmission line assembly T1, T1', T1" and the electronic structure package T2 provided by the present disclosure, by the technical feature of "the electromagnetic shielding element 1 (1') including the quantum well structure 12," the electromagnetic noise can be absorbed so as to suppress electromagnetic interference.

Accordingly, in the electromagnetic shielding element 1 of the embodiment of the present disclosure, the quantum well structure 12 can cooperate with the isolating layer 111 and the conductive layer 110 to further shield electromagnetic interference and suppress crosstalk between high frequency signals. In addition, the thickness of the plurality of barrier layer 120 and the carrier confined layer 121 forming the quantum well structure 12 is very thin. Compared with the existing electromagnetic wave shielding layer (metal layer or carbon layer), the total thickness of the electromagnetic shielding element 1 of the embodiment of the present disclosure can be further reduced, but the electromagnetic shielding element 1 can still have good shielding electromagnetic interference and noise suppression effect.

In addition, by adjusting the material and thickness of the barrier layer 120 and the carrier confined layer 121 in the quantum well structure 12, the electromagnetic shielding elements 1, 1' can be adapted to absorb electromagnetic waves of different frequency band, and the application range of the electromagnetic shielding elements 1, 1' of the embodiment of the present disclosure is increased. In other words, the electromagnetic shielding elements 1, 1' of the embodiments of the present disclosure can be applied as an electronic component in addition to the transmission line assemblies T1, T1', T1" and the electronic structure package T2 of the embodiment of the present disclosure, and can also be applied to one layer of an electronic component (such as a capacitor), or applied to other electronic devices, and the present disclosure is not limited thereto.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electromagnetic shielding element comprising a quantum well structure, wherein the quantum well structure includes is a multiple quantum well structure, and includes a plurality of the barrier layers and a plurality of the carrier confined layers that are stacked alternately, at least one of the carrier confined layer between two of the barrier layers, and a thickness of each of the barrier layers is between 0.1 nm and 500 nm, and a thickness of the carrier confined layer is between 0.1 nm and 500 nm;
   wherein the barrier layers include an outer barrier layer and an inner barrier layer, and the carrier confined layers are located between the outer barrier layer and the inner barrier layer; and
   wherein at least two of the barrier layers or at least two of the carrier confined layers have different thicknesses, respectively.

2. The electromagnetic shielding element according to claim 1, further comprising: a base layer, wherein the quantum well structure is disposed on the base layer.

3. The electromagnetic shielding element according to claim 2, wherein the base layer includes an isolating layer, a thickness of the isolating layer is between 5 μm and 100 μm, and the material of the isolating layer is at least one selected from the group consisting of polyimide (PI), polyethylene (PE), polypropylene (PP), epoxy resin (Epoxy), poly (methyl methacrylate) (PMMA), polyethylene terephthalate (PET), polyethylene naphthalate (PEN), polycarbonate (PC), polyether sulfone (PES), polyarylate, liquid crystal polymer (LCP) and any combination thereof.

4. The electromagnetic shielding element according to claim 3, wherein the base layer further includes a conductive layer, the conductive layer and the isolating layer are located on the same side of the quantum well structure, and a thickness of the conductive layer is between 5 μm and 200 μm.

5. The electromagnetic shielding element according to claim 4, wherein the material of the conductive layer is selected from the group consisting of gold, silver, copper, iron, zinc, lead, cobalt, chromium, aluminum, nickel, and any combination thereof or any alloy thereof.

6. The electromagnetic shielding element according to claim 4, wherein the isolating layer is located between the conductive layer and the quantum well structure.

7. The electromagnetic shielding element according to claim 1, wherein the material of the barrier layer is an oxide, a nitride, an oxynitride or any combination thereof.

8. The electromagnetic shielding element according to claim 1, wherein the material of the carrier confined layer is a semiconductor, a metal, an alloy, or any combination thereof.

9. The electromagnetic shielding element according to claim 1, wherein an energy barrier formed at the interface between a conduction band of each of the barrier layers and a conduction band of the adjacent carrier confined layer is at least 0.2 eV.

10. The electromagnetic shielding element according to claim 1, wherein at least two of the barrier layers or at least two of the carrier confined layers are made of different materials.

11. The electromagnetic shielding element according to claim 1, wherein the quantum well structure further includes another carrier confined layer between the two of the barrier layers, and the two carrier confined layers are directly connected to each other and have different energy gap, respectively.

12. A transmission line assembly, comprising:
   a wire assembly including at least a wire and an insulation layer covering the wire; and
   an electromagnetic shielding element disposed on the wire assembly and including a quantum well structure, wherein the quantum well structure includes at least two barrier layers and at least one carrier confined layer located between the two barrier layers.

13. The electromagnetic shielding element according to claim 12, further comprising: a base layer, wherein the quantum well structure is located between the base layer and the wire assembly.

14. The electromagnetic shielding element according to claim 13, wherein the base layer includes an isolating layer and a conductive layer, and the isolating layer is located between the quantum well structure and the conductive layer.

15. The electromagnetic shielding element according to claim 12, wherein the quantum well structure is a multiple quantum well structure, the quantum well structure includes a plurality of barrier layers and a plurality of carrier confined layers, the barrier layers include an outer barrier layer and an inner barrier layer, and the carrier confined layers are located between the outer barrier layer and the inner barrier layer.

16. The electromagnetic shielding element according to claim 12, wherein a thickness of each of the barrier layers is between 0.1 nm and 500 nm, and a thickness of the carrier confined layer is between 0.1 nm and 500 nm.

17. An electronic structure package, comprising:
   an electronic component;
   a protective layer covering the electronic component; and
   an electromagnetic shielding element disposed on the protective layer, wherein the electromagnetic shielding element includes at least one quantum well structure including at least two barrier layers and at least one carrier confined layer between the two barrier layers.

18. The electromagnetic shielding element according to claim 17, wherein the electronic component is a resistor, a capacitor or a chip.

19. An electronic structure package applied to a filter circuit, and comprising at least: an electronic component, which is a capacitor and includes two electrode structures and a dielectric layer sandwiched between the two electrode structures, wherein at least one of the electrode structures includes a quantum well structure, and the quantum well structure includes at least two barrier layers and at least one carrier confined layer between the two barrier layers.

* * * * *